United States Patent
Wang et al.

(10) Patent No.: US 12,225,764 B2
(45) Date of Patent: Feb. 11, 2025

(54) DISPLAY PANEL, DISPLAY DEVICE, AND METHOD FOR MANUFACTURING DISPLAY PANEL

(71) Applicants: Chengdu BOE Optoelectronics Technology Co., Ltd., Sichuan (CN); BOE Technology Group Co., Ltd., Beijing (CN)

(72) Inventors: Jiaxiang Wang, Beijing (CN); Yonghui Luo, Beijing (CN); Binfeng Feng, Beijing (CN); Zijie Zhang, Beijing (CN); Hailong Ran, Beijing (CN); Fei Li, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 205 days.

(21) Appl. No.: 17/626,762

(22) PCT Filed: Mar. 11, 2021

(86) PCT No.: PCT/CN2021/080256
§ 371 (c)(1),
(2) Date: Jan. 12, 2022

(87) PCT Pub. No.: WO2021/185149
PCT Pub. Date: Sep. 23, 2021

(65) Prior Publication Data
US 2023/0006182 A1    Jan. 5, 2023

(30) Foreign Application Priority Data

Mar. 17, 2020  (WO) .............. PCT/CN2020/079760

(51) Int. Cl.
*H10K 50/86*    (2023.01)
*H10K 50/87*    (2023.01)
(Continued)

(52) U.S. Cl.
CPC .............. *H10K 50/86* (2023.02); *H10K 50/87* (2023.02); *H10K 59/40* (2023.02); *H10K 71/00* (2023.02)

(58) Field of Classification Search
CPC ........ H10K 50/86; H10K 50/87; H10K 59/40; H10K 71/00; H10K 59/8794; H10K 59/8791; G02F 1/1333
See application file for complete search history.

(56) References Cited

U.S. PATENT DOCUMENTS

| 2007/0115401 A1 | 5/2007 | Tsubokura et al. |
| 2016/0161085 A1 | 6/2016 | Kwon et al. |

(Continued)

FOREIGN PATENT DOCUMENTS

| CN | 103294237 A | 9/2013 |
| CN | 104765185 A | 7/2015 |

(Continued)

OTHER PUBLICATIONS

CN202180000445.8 first office action.

*Primary Examiner* — Kevin Quarterman
(74) *Attorney, Agent, or Firm* — IPro, PLLC

(57) ABSTRACT

A display panel, a display device, and a method for manufacturing the display panel, mitigating the problem that display panels in the prior art still have wide bezels. The display panel comprises: a display module (1); a polarizer (2) located on a light exit surface of the display module (1), at least one outer edge of the polarizer (2) being flush with an outer edge of the display module (1); and a cover plate (3) located on the surface of the polarizer (2) far away from the (Continued)

display module (1), the outer edges of the cover plate (3) except a binding side being flush with the outer edges of the display module (1) except the binding side.

20 Claims, 15 Drawing Sheets

(51) Int. Cl.
*H10K 59/40* (2023.01)
*H10K 71/00* (2023.01)

(56) References Cited

U.S. PATENT DOCUMENTS

| | | | |
|---|---|---|---|
| 2016/0274411 A1 | 9/2016 | Chen et al. | |
| 2019/0027708 A1 | 1/2019 | Kim | |
| 2019/0265823 A1 | 8/2019 | Luo et al. | |
| 2021/0349345 A1 | 11/2021 | Liao | |
| 2022/0320475 A1* | 10/2022 | Shi | H10K 71/00 |

FOREIGN PATENT DOCUMENTS

| | | |
|---|---|---|
| CN | 107359284 A | 11/2017 |
| CN | 108257511 A | 7/2018 |
| CN | 207817244 U | 9/2018 |
| CN | 207819990 U | 9/2018 |
| CN | 108646444 A | 10/2018 |
| CN | 108646462 A | 10/2018 |
| CN | 108663842 A | 10/2018 |
| CN | 109143678 A | 1/2019 |
| CN | 109782938 A | 5/2019 |
| CN | 110224084 A | 9/2019 |
| CN | 110764299 A | 2/2020 |
| JP | 2010237354 A | 10/2010 |
| WO | 2019095630 A1 | 5/2019 |

* cited by examiner

--Prior Art--

DISPLAY PANEL, DISPLAY DEVICE, AND METHOD FOR MANUFACTURING DISPLAY PANEL

CROSS REFERENCE TO RELATED APPLICATIONS

The present application is a National Stage of International Application No. PCT/CN2021/080256, filed on Mar. 11, 2021, which claims priority to the Chinese Patent Application No. PCT/CN2020/079760, filed to the China National Intellectual Property Administration on Mar. 17, 2020, both of which are incorporated herein by reference.

FIELD

The present disclosure relates to the technical field of display, in particular to a display panel, a display device and a method for manufacturing the display panel.

BACKGROUND

With increasing development of a communication technology, a mobile display device such as mobile phone, or a smart wearable apparatus is widely applied, and a full screen phone becomes a current development trend of mobile phones, so a screen-to-body ratio of the design ought to be as large as possible, which needs a narrower bezel. However, there is a problem that display panels in the prior art still have wide bezels.

SUMMARY

The present disclosure provides a display panel, including: a display module; a polarizer, on a light exit surface of the display module, wherein at least one outer edge of the polarizer is flush with an outer edge of the display module; and a cover film, on one surface of the polarizer away from the display module, wherein an outer edge of the cover film except an outer edge of the cover film at a bonding side is flush with an outer edge of the display module except an outer edge of the display module at the bonding side.

In a possible implementation, the display module includes: a first side edge and a second side edge opposite to each other, a third side edge connected with one end of the first side edge and one end of the second side edge, and a fourth side edge connected with the other end of the first side edge and the other end of the second side edge; the polarizer includes: a first polarization side edge corresponding to the first side edge, a second polarization side edge corresponding to the second side edge, a third polarization side edge corresponding to the third side edge, and a fourth polarization side edge corresponding to the fourth side edge; and the cover film includes: a first cover film side edge corresponding to the first side edge, a second cover film side edge corresponding to the second side edge, a third cover film side edge corresponding to the third side edge, and a fourth cover film side edge corresponding to the fourth side edge.

In a possible implementation, the bonding side includes the first side edge; the second polarization side edge of the polarizer and the second cover film side edge of the cover film are both flush with the second side edge of the display module; the third polarization side edge of the polarizer and the third cover film side edge of the cover film are both flush with the third side edge of the display module; the fourth polarization side edge of the polarizer and the fourth cover film side edge of the cover film are both flush with the fourth side edge of the display module; and the first polarization side edge of the polarizer is flush with the first cover film side edge of the cover film.

In a possible implementation, the bonding side includes the first side edge and the second side edge; the third polarization side edge of the polarizer and the third cover film side edge of the cover film are both flush with the third side edge of the display module; the fourth polarization side edge of the polarizer and the fourth cover film side edge of the cover film are both flush with the fourth side edge of the display module; the first polarization side edge of the polarizer is flush with the first cover film side edge of the cover film; and the second polarization side edge of the polarizer is flush with the second cover film side edge of the cover film.

In a possible implementation, the display module includes a display film layer and a touch film layer on one side of the display film layer facing the polarizer; the touch film layer is provided with a first touch portion overlapping with the polarizer, and a second touch portion extending from the first touch portion towards the second side edge; and the touch film layer is bonded to a touch chip through the second touch portion.

In a possible implementation, the display film layer includes a first display portion overlapping with the touch film layer, and a second display portion extending from the first display portion towards the first side edge; and the display film layer is bonded to a display chip through the second display portion.

In a possible implementation, the bonding side includes the first side edge, the second side edge and the third side edge; the fourth polarization side edge of the polarizer and the fourth cover film side edge of the cover film are both flush with the fourth side edge of the display module; the first polarization side edge of the polarizer is flush with the first cover film side edge of the cover film; the second polarization side edge of the polarizer is flush with the second cover film side edge of the cover film; and the third polarization side edge of the polarizer is flush with the third cover film side edge of the cover film.

In a possible implementation, the display panel further includes: a cooling fin, on one surface of the display module away from the polarizer.

In a possible implementation, the display module includes a back film, and an orthographic projection of the cooling fin on the back film is covered by a region occupied by the back film.

In a possible implementation, the display module includes a back film, and an orthographic projection of the cooling fin on the back film covers a region occupied by the back film.

In a possible implementation, the cooling fin is of an integrated structure.

In a possible implementation, the cooling fin includes a first sub-cooling layer, and a second sub-cooling layer on one side of the first sub-cooling layer facing the display module.

In a possible implementation, a thickness of the first sub-cooling layer is larger than that of the second sub-cooling layer.

In a possible implementation, the first sub-cooling layer is provided with a plurality of patterns.

In a possible implementation, an adhesive layer is between the first sub-cooling layer and the second sub-cooling layer.

In a possible implementation, a material of the cooling fin is stainless steel.

In a possible implementation, a first optical clear adhesive is between the cooling fin and the display module, and the cooling fin and the display module are laminated through the first optical clear adhesive.

In a possible implementation, a second optical clear adhesive is between the cover film and the polarizer, and an outer edge of the second optical clear adhesive except an outer edge of the second optical clear adhesive at the bonding side is flush with the outer edge of the display module except the outer edge of the display module at the bonding side.

In a possible implementation, the back film includes a polysulfonamide fiber film layer and a polyimide film layer which are laminated.

An embodiment of the present disclosure further provides a display device, including the display panel provided by the embodiment of the present disclosure.

An embodiment of the present disclosure further provides a method for manufacturing a display panel, including: laminating a polarizer to a light exit surface of a display module; laminating a cover film to one surface of the polarizer away from the display module; and performing integrated shape cutting on an outer edge of the display module with the polarizer and the cover film laminated thereto except an outer edge of the display module at a bonding side.

In a possible implementation, after the performing integrated shape cutting on the display module with the polarizer and the cover film laminated thereto, the method further includes: laminating a cooling fin to one surface of the display module away from the polarizer.

In a possible implementation, the laminating the cooling fin to the surface of the display module away from the polarizer includes: laminating the cooling fin a size of which is smaller than a size of the display module to the surface of the display module away from the polarizer.

In a possible implementation, the laminating the cooling fin to the surface of the display module away from the polarizer includes: laminating the cooling fin to the surface of the display module away from the polarizer through a first optical clear adhesive.

In a possible implementation, after the performing integrated shape cutting on the display module with the polarizer and the cover film laminated thereto and before the laminating the cooling fin to the surface of the display module away from the polarizer, the method further includes: laminating a protective film to one surface of the cover film away from the polarizer.

In a possible implementation, the performing integrated shape cutting on the display module with the polarizer and the cover film laminated thereto includes:
performing integrated shape cutting on the display module with the polarizer and the cover film laminated thereto through a laser cutting process.

In a possible implementation, the laminating the cover film to the surface of the polarizer away from the display module includes:
laminating the cover film to the surface of the polarizer away from the display module through a second optical clear adhesive.

DETAILED DESCRIPTION OF THE EMBODIMENTS

In order to make objectives, technical solutions and advantages of embodiments of the present disclosure clearer, the technical solutions of the embodiments of the present disclosure will be described clearly and completely below with reference to accompanying drawings of the embodiments of the present disclosure. Apparently, the described embodiments are some, but not all, of the embodiments of the present disclosure. On the basis of the described embodiments of the present disclosure, all of the other embodiments obtained by those of ordinary skill in the art without creative work fall within the protection scope of the present disclosure.

Unless otherwise defined, technical or scientific terms used by the present disclosure should be commonly understood by those of ordinary skill in the art of the present disclosure. "First", "second" and other similar words used in the present disclosure do not represent any sequence, quantity or significance and only serve to distinguish different components. "Include" or "contain" and other similar words mean that a component or an item preceding the word covers components or items and their equivalents listed after the word without excluding other components or items. "Connection" or "connected" and other similar words are not limited to a physical or mechanical connection, but may include an electrical connection in spite of being direct or indirect. "Upper", "lower", "left", "right" and the like are only used for denoting a relative position relation, and when an absolute position of a described object changes, the relative position relation may also change correspondingly.

In order to make the following description of the embodiments of the present disclosure clear and concise, the present disclosure omits detailed description of known functions and known components.

Figure 1:
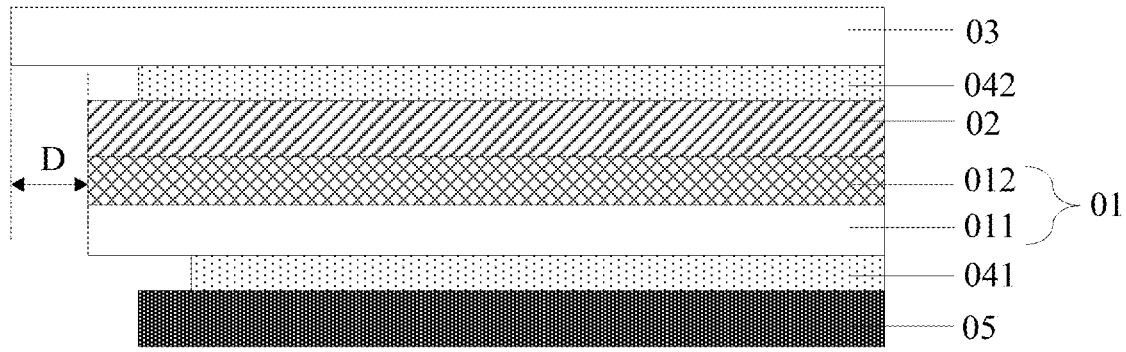
FIG. 1 is a schematic structural diagram of a display panel in the prior art.

As shown in FIG. 1, which is a schematic diagram of lamination of a traditional non-integrated-cut display panel, the display panel may include a display module 01 (may include a back film 011 and a display film layer located on the back film 011), a polarizer (POL) 02 located on a light exit surface of the display module 01, a cover film 03 located on one surface of the polarizer 02 away from the display module 01, and a cooling fin (SUS) 05 located on one surface of the display module 01 away from the polarizer 02. The cover film 03 is laminated with the polarizer through a second optical clear adhesive (OCA2) 042, the cooling fin 05 is laminated with the display module 01 through a first optical clear adhesive (OCA1) 041, and the display module 01 may include the back film 011 and a panel film layer 012 located on the back film 011. The display module 01 and the polarizer 02 are laminated with each other and then subjected to shape cutting and then laminated to the cover film 03. As there are a lamination tolerance during laminating, a tolerance of laser cutting during cutting and a tolerance of cover film processing, an outline dimension of the cover film 03 needs unilateral expanding relative to the display module 01. Specific tolerances and their calculations are as follows:

$$D=\pm\sqrt{A^2+B^2+C^2}+=\pm 0.16.$$

Wherein A represents the tolerance of cover film laminating, especially, is ±0.1 mm, B represents the tolerance of laser cutting during shape cutting, especially, is ±0.075 mm, C represents the tolerance of cover film processing, especially, is ±0.1 mm, so unilateral expanding D of the cover film 03 relative to the display module meets: D=0.2 mm (values calculated by the above formulas are theoretical values, a certain allowance is usually maintained for the sake of a yield and lowering process difficulty, and 0.16 is rounded up to be 0.2), which can guarantee that an edge of the display module 01 does not exceed an edge of the cover film 03 during laminating. Therefore, this manufacturing mode will lead to a large bezel of a finally formed display module.

Figure 2:
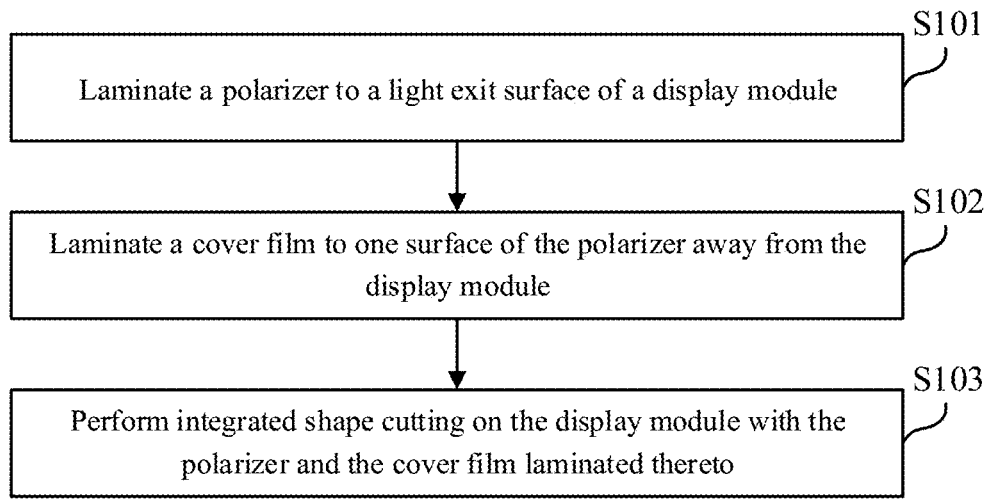
FIG. 2 is a flowchart of a method for manufacturing a display panel provided by an embodiment of the present disclosure.

Based on this, referring to FIG. 2, an embodiment of the present disclosure provides a method for manufacturing a display panel, including the following.

Step S101, a polarizer is laminated to a light exit surface of a display module. Specifically, the display module may be a display module in an Organic Light-Emitting Diode (OLED), and may include a back film and a panel film layer fabricated on the back film. The panel film layer may include a substrate film layer, and a display film layer and a touch film layer sequentially located on the substrate film layer.

Step S102, a cover film is laminated to one surface of the polarizer away from the display module.

Figure 7:
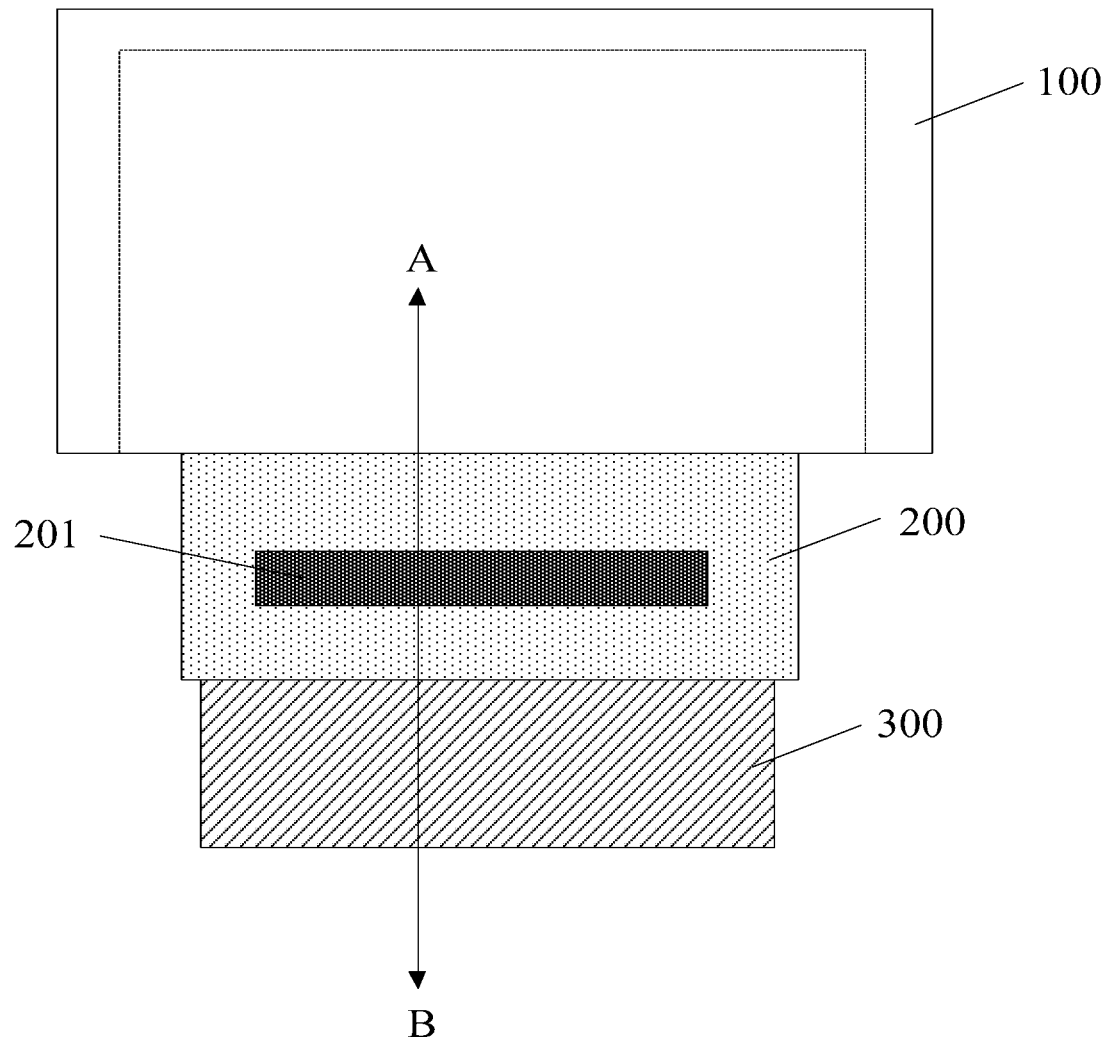
FIG. 7 is a schematic structural diagram of a display device provided by an embodiment of the present disclosure.

Step S103, integrated shape cutting is performed on an outer edge of the display module with the polarizer and the cover film laminated thereto except an outer edge of the display module at a bonding side. For example, as shown in FIG. 7, the display panel 100 has an upper edge, a lower edge, a left edge and a right edge. The lower edge is configured to be bonded to a chip on film 200, that is, the lower edge serves as the bonding side. Shape cutting is mainly specific to non-bonding sides of the display panel 100 during cutting, that is, the upper edge, the left edge and the right edge are cut, as shown by a dotted line in FIG. 7.

The method for manufacturing the display panel provided by the embodiment of the present disclosure, includes: the polarizer is laminated to the light exit surface of the display module; and the cover film is laminated to the surface of the polarizer away from the display module. Integrated shape cutting is performed on the display module with the polarizer and the cover film laminated thereto, that is, laminating of the polarizer and the cover film to the surface of the display module is completed, and then integrated shape cutting is performed on the display module with the polarizer and the cover film laminated thereto. Compared with the prior art that in general, the display module with the polarizer laminated thereto is cut soon after the polarizer is laminated, and then the cover film is laminated, which may need the cover film to have a reserved expanding size relative to the display module due to estimation of process errors, and consequently, the finally formed display panel has a large bezel. By means of the method for manufacturing the display panel provided by the embodiment of the present disclosure, cutting is performed after the cover film is laminated, so the problem that the cover film needs to have the reserved expanding size and consequently the bezel of the display panel is wide can be avoided.

Figure 3:
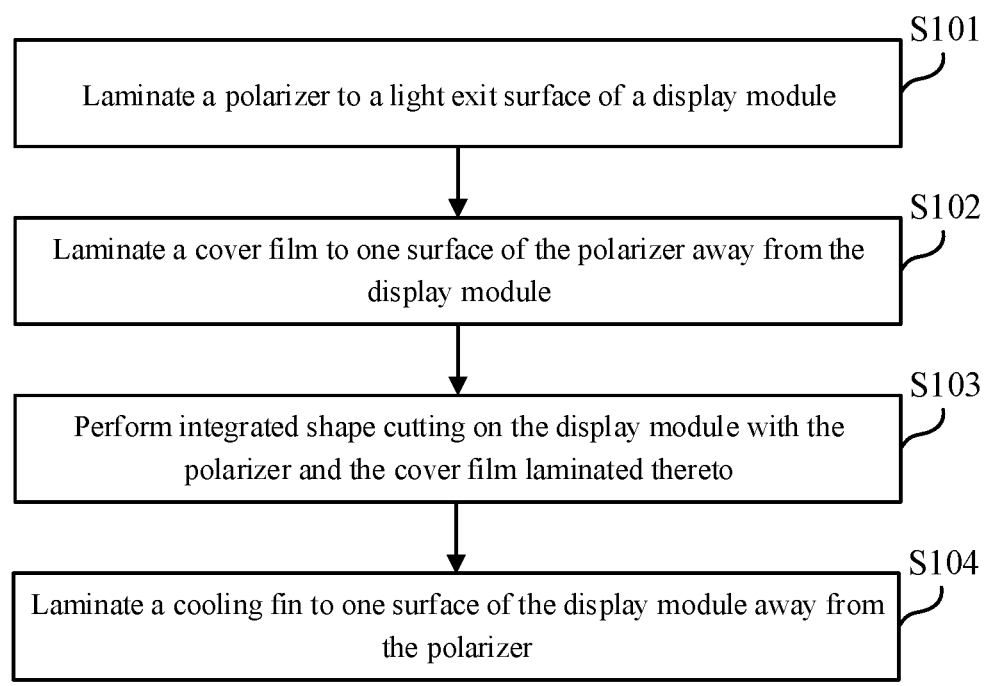
FIG. 3 is a flowchart of a method for manufacturing a display panel containing a cooling fin provided by an embodiment of the present disclosure.

During specific implementation, referring to FIG. 3, after step S103, that is, after integrated shape cutting is performed on the display module with the polarizer and the cover film laminated thereto, the method further includes: step S104, a cooling fin is laminated to one surface of the display module away from the polarizer. Specifically, a size of the laminated cooling fin may be smaller than a size of the display module. That is, the laminating the cooling fin to the surface of the display module away from the polarizer includes: the cooling fin the size of which is smaller than the size of the display module is laminated to the surface of the display module away from the polarizer. In the embodiment of the present disclosure, the cooling fin is laminated to the surface of the display module away from the polarizer so as to dissipate heat generated by the display module during displaying. The size of the cooling fin is smaller than the size of the display module, so that the large bezel of the display panel due to a too large cooling fin can be avoided. It can be understood that the size of the cooling fin is smaller than the size of the display module, which is size comparison between laminated surfaces of them when the both are laminated. In other words, for example, if the cooling fin is laminated to the back film of the display module, a region occupied by the back film covers an orthographic projection of the cooling fin on the back film. Specifically, a material of the cooling fin may be metal, especially, stainless steel (SUS).

During specific implementation, the laminating the cooling fin to the surface of the display module away from the polarizer includes: the cooling fin is laminated on the surface of the display module away from the polarizer through a first optical clear adhesive.

Figure 4:
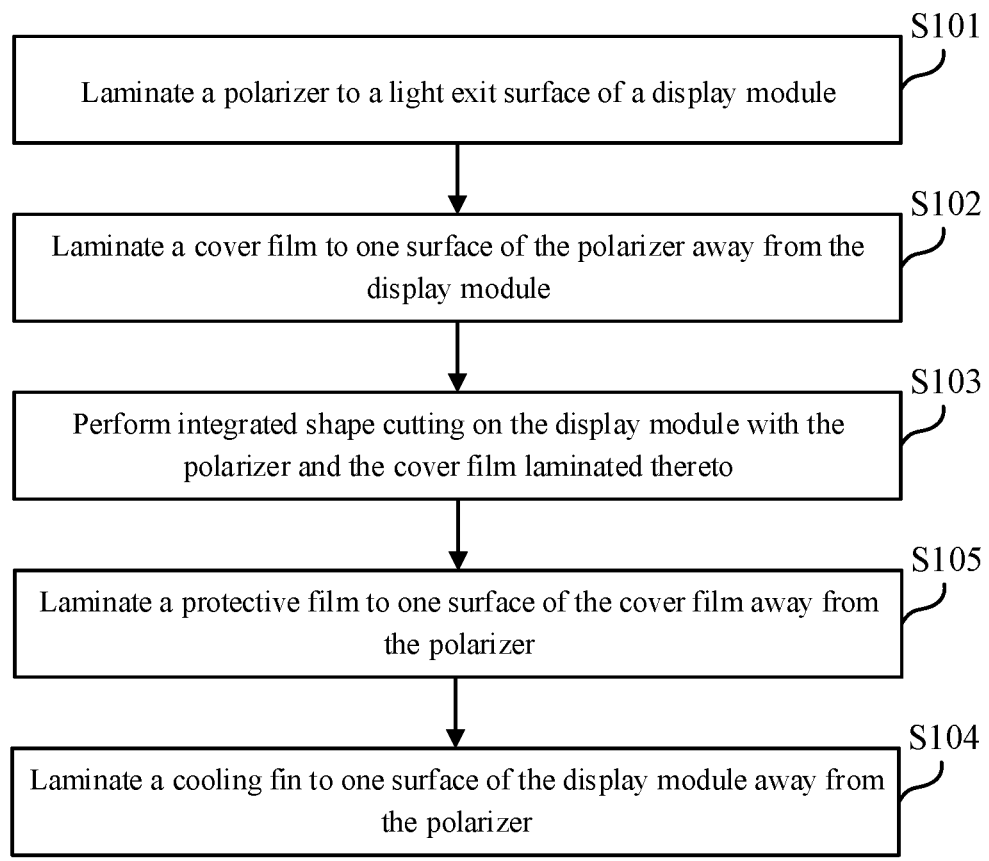
FIG. 4 is a flowchart of a method for manufacturing a display panel containing a protective film provided by an embodiment of the present disclosure.

During specific implementation, as shown in FIG. 4, after performing integrated shape cutting on the display module with the polarizer and the cover film laminated thereto and before laminating the cooling fin to the surface of the display module away from the polarizer, the method further includes: step S105, a protective film is laminated to one surface of the cover film away from the polarizer. As shown in FIG. 6B, the protective film 6 is laminated to the surface of the cover film 3 away from the polarizer 2. A size of the protective film 6 may be smaller than a size of the cover film, that is, an orthographic projection of the protective film 6 on the cover film 3 is covered by a region occupied by the cover film 3 so as to avoid influence on a size of a bezel of the display module. In the embodiment of the present disclosure, before laminating the cooling fin, the method further includes: the protective film is laminated to the surface of the cover film away from the polarizer so that a situation that after the cover film is laminated, it needs turning over to laminate the cooling fin to the other surface of the display module, and consequently, a surface of the cover film may be abraded.

During specific implementation, in step S103, that is, integrated shape cutting is performed on the display module with the polarizer and the cover film laminated thereto, includes: integrated shape cutting is performed on the display module with the polarizer and the cover film laminated thereto through a laser cutting process.

During specific implementation, in step S102, that is, the cover film is laminated to the surface of the polarizer away from the display module, includes: the cover film is laminated to the surface of the polarizer away from the display module through a second optical clear adhesive.

Figure 5A:
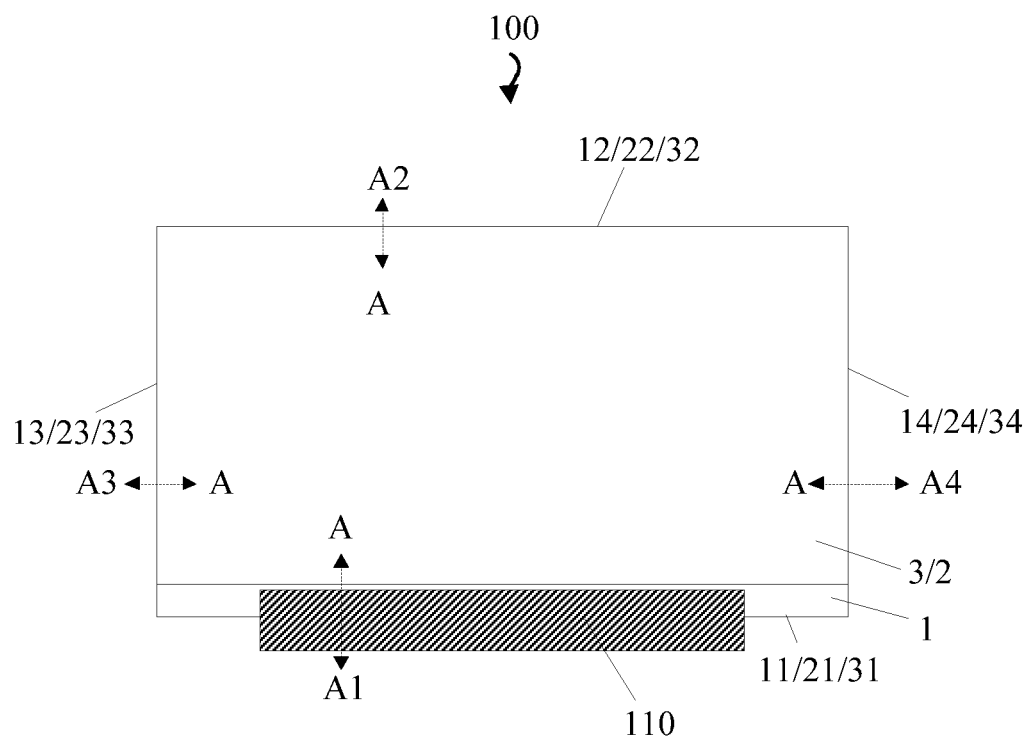
FIG. 5A is a first schematic top view of a display panel provided by an embodiment of the present disclosure.
Figure 5B:
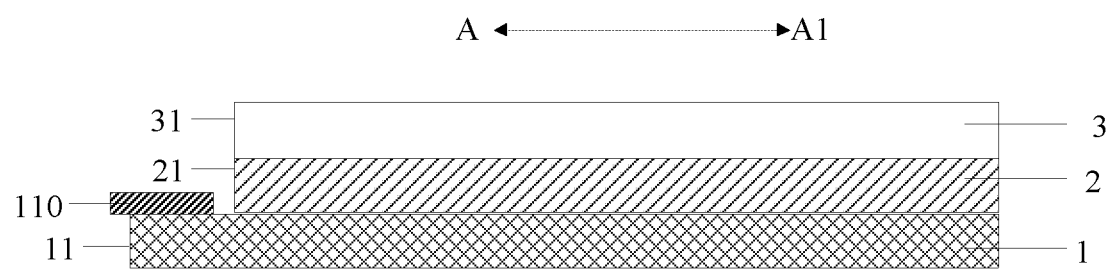
FIG. 5B is a first schematic sectional view of a display panel provided by an embodiment of the present disclosure.
Figure 5C:
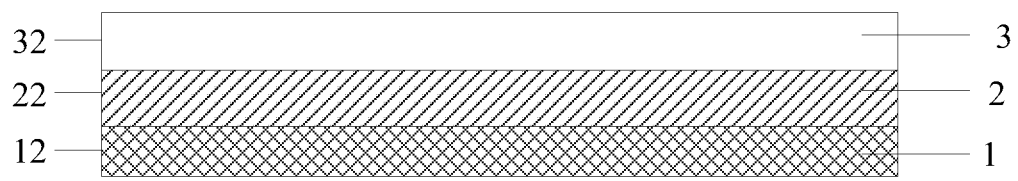
FIG. 5C is a second schematic sectional view of a display panel provided by an embodiment of the present disclosure.
Figure 5D:
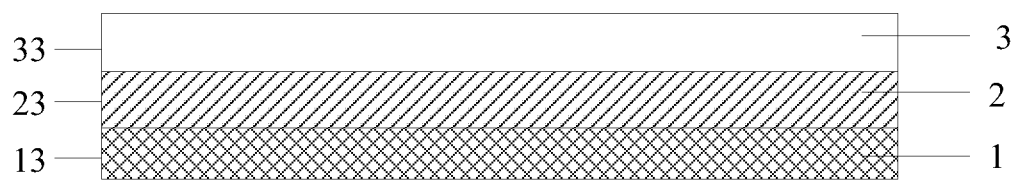
FIG. 5D is a third schematic sectional view of a display panel provided by an embodiment of the present disclosure.
Figure 5E:
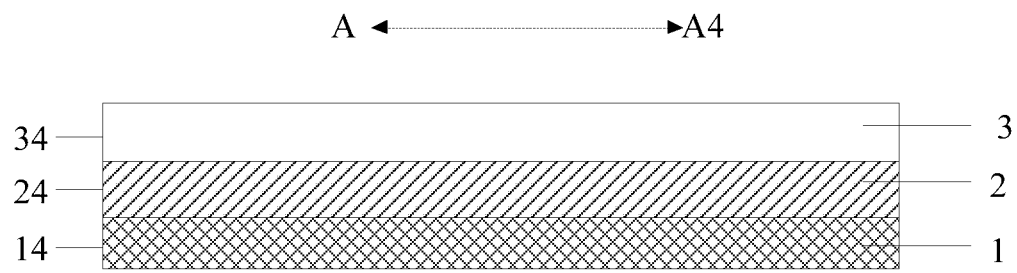
FIG. 5E is a fourth schematic sectional view of a display panel provided by an embodiment of the present disclosure.
Figure 5F:
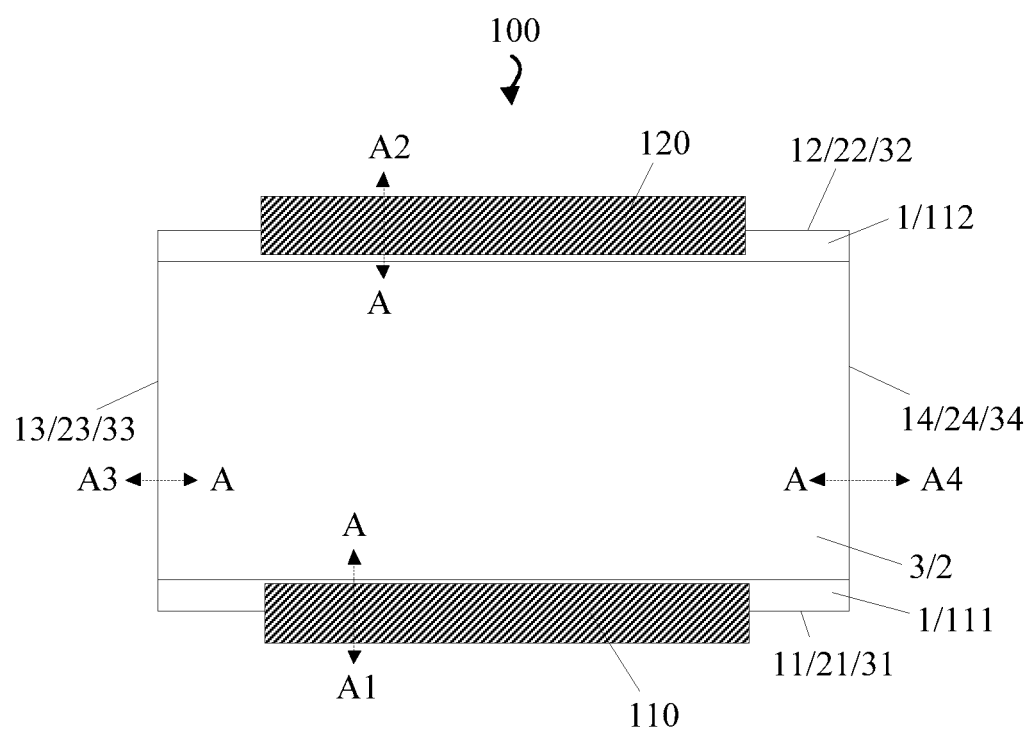
FIG. 5F is a second schematic top view of a display panel provided by an embodiment of the present disclosure.
Figure 5G:
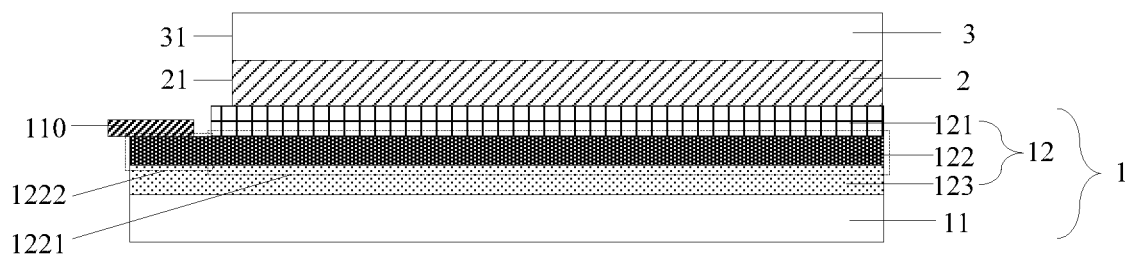
FIG. 5G is a fifth schematic sectional view of a display panel provided by an embodiment of the present disclosure.
Figure 5H:
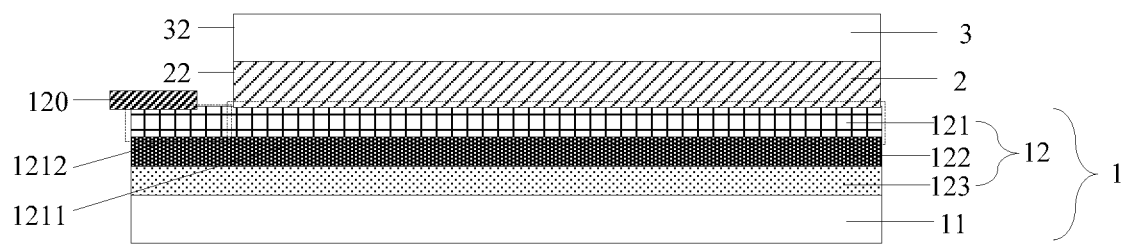
FIG. 5H is a sixth schematic sectional view of a display panel provided by an embodiment of the present disclosure.
Figure 5I:
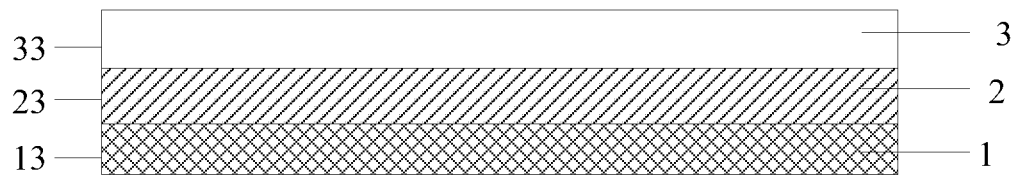
FIG. 5I is a seventh schematic sectional view of a display panel provided by an embodiment of the present disclosure.
Figure 5J:
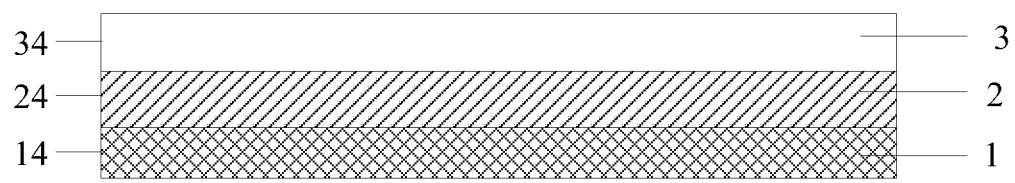
FIG. 5J is an eighth schematic sectional view of a display panel provided by an embodiment of the present disclosure.
Figure 5K:
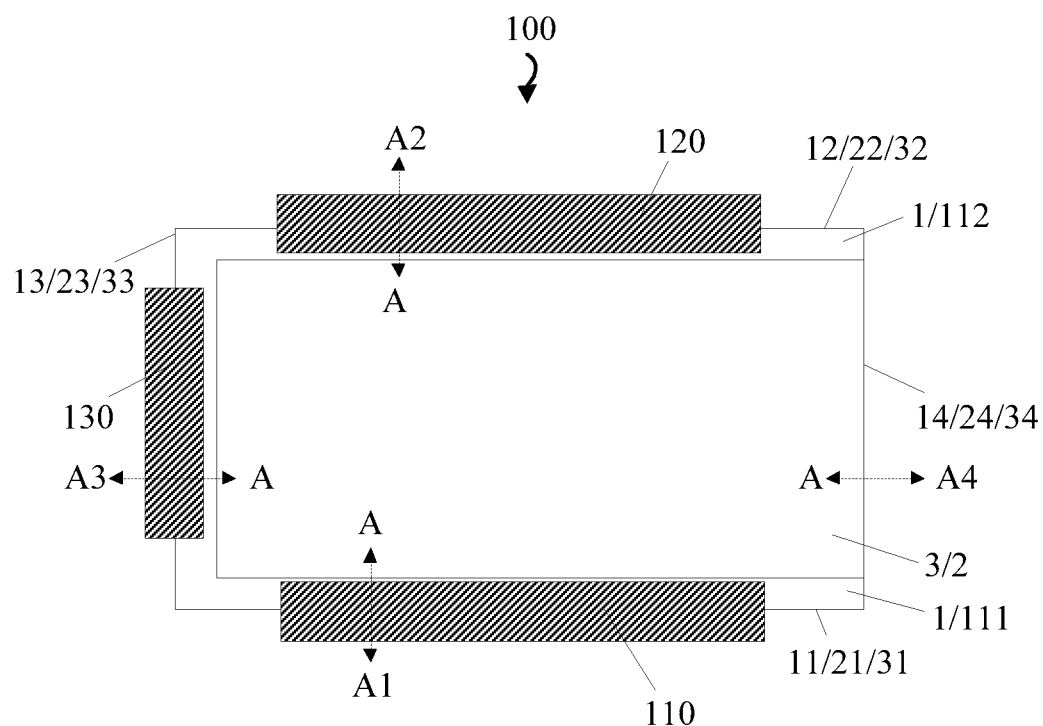
FIG. 5K is a third schematic top view of a display panel provided by an embodiment of the present disclosure.
Figure 5L:
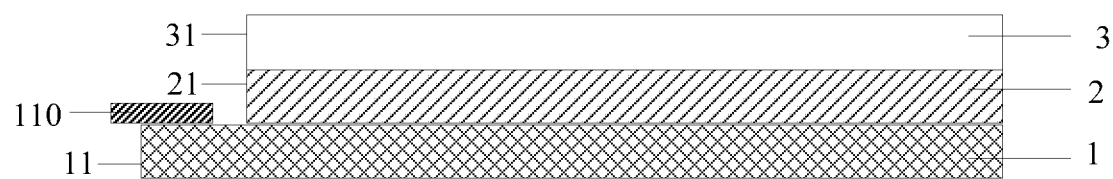
FIG. 5L is a ninth schematic sectional view of a display panel provided by an embodiment of the present disclosure.
Figure 5M:
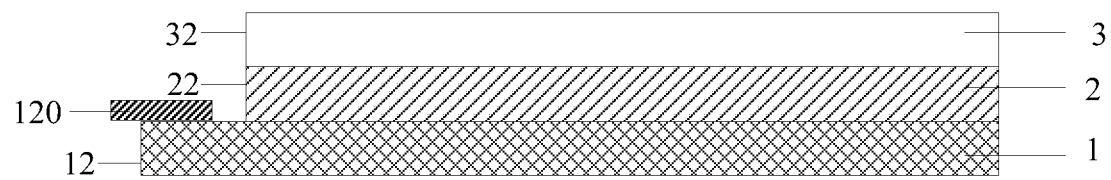
FIG. 5M is a tenth schematic sectional view of a display panel provided by an embodiment of the present disclosure.
Figure 5N:
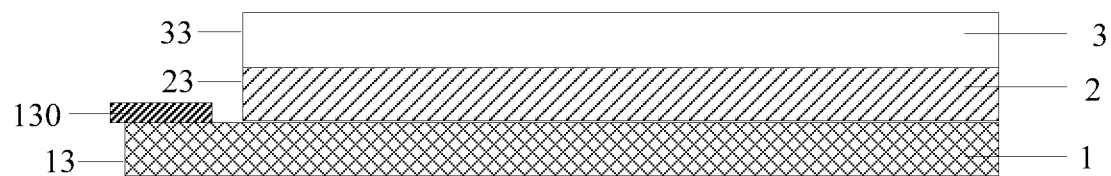
FIG. 5N is an eleventh schematic sectional view of a display panel provided by an embodiment of the present disclosure.
Figure 5O:
FIG. 5O is a twelfth schematic sectional view of a display panel provided by an embodiment of the present disclosure.
Figure 5O:
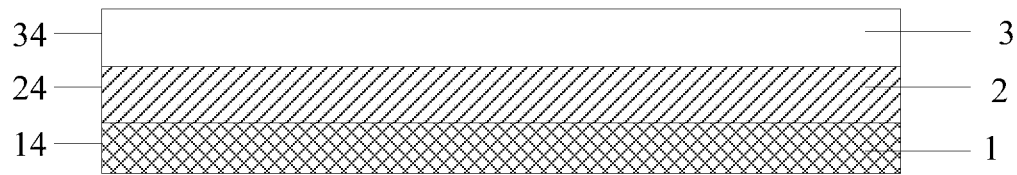

Based on the same disclosed concept, referring to FIG. 5A to FIG. 5O, an embodiment of the present disclosure further provides a display panel, including: a display module 1; a polarizer 2, located on a light exit surface of the display module 1 (for example, in FIG. 6A, an upper surface of the display module 1 is the light exit surface), wherein at least one outer edge of the polarizer 2 is flush with an outer edge of the display module 1; and a cover film 3, located on one surface of the polarizer 2 away from the display module 1, wherein an outer edge of the cover film 3 except an outer edge of the cover film 3 at a bonding side is flush with an outer edge of the display module 1 except an outer edge of the display module 1 at the bonding side.

The display panel provided by the embodiment of the present disclosure, includes: the display module 1; the polarizer 2, located on the light exit surface of the display module 1, wherein the at least one outer edge of the polarizer 2 is flush with the outer edge of the display module 1; and the cover film 3, located on the surface of the polarizer 2 away from the display module 1, wherein the outer edge of the cover film 3 except the outer edge of the cover film 3 at the bonding side is flush with the outer edge of the display module 1 except the outer edge of the display module 1 at the bonding side. That is, during manufacturing, laminating of the polarizer and the cover film to the surface of the display module can be completely, and then integrated shape cutting is performed on the display module with the polarizer and the cover film laminated thereto. Compared with the prior art that in general, the display module with the polarizer laminated thereto is cut soon after the polarizer is laminated, and then the cover film is laminated, which may need the cover film to have a reserved expanding size relative to the display module due to estimation of process errors, and consequently, the finally formed display panel has a large bezel. As for the display panel provided by the embodiment of the present disclosure, cutting is performed after the cover film is laminated, so the problem that the cover film needs to have the reserved expanding size and consequently the bezel of the display panel is wide can be avoided.

During specific implementation, the display panel may be rectangular. Referring to FIG. 5A, FIG. 5F and FIG. 5K, the display module 1 includes: a first side edge 11 and a second side edge 12 opposite to each other, a third side edge 13 connected with one end of the first side edge 11 and one end of the second side edge 12, and a fourth side edge 14 connected with the other end of the first side edge 11 and the other end of the second side edge 12.

The polarizer 2 includes: a first polarization side edge 21 corresponding to the first side edge 11, a second polarization side edge 22 corresponding to the second side edge 12, a third polarization side edge 23 corresponding to the third side edge 13, and a fourth polarization side edge 24 corresponding to the fourth side edge 14.

The cover film 3 includes: a first cover film side edge 31 corresponding to the first side edge 11, a second cover film side edge 32 corresponding to the second side edge 12, a third cover film side edge 33 corresponding to the third side edge 13, and a fourth cover film side edge 44 corresponding to the fourth side edge 14.

During specific implementation, the bonding side may include one side or two sides or three sides, which is illustrated below.

For example, as shown in FIG. 5A, FIG. 5B, FIG. 5C, FIG. 5D and FIG. 5E, FIG. 5B is a schematic sectional view in a position of a dotted line AA1 in FIG. 5A, FIG. 5C is a schematic sectional view in a position of a dotted line AA2 in FIG. 5A, FIG. 5D is a schematic sectional view in a position of a dotted line AA3 in FIG. 5A, and FIG. 5E is a schematic sectional view in a position of a dotted line AA4 in FIG. 5A. The bonding side includes the first side edge 11; the second polarization side edge 22 of the polarizer 2 and the second cover film side edge 32 of the cover film 3 are both flush with the second side edge 12 of the display module 1; the third polarization side edge 23 of the polarizer 2 and the third cover film side edge 33 of the cover film 3 are both flush with the third side edge 13 of the display module 1; the fourth polarization side edge 24 of the polarizer 2 and the fourth cover film side edge 34 of the cover film 3 are both flush with the fourth side edge 14 of the display module 1; and the first polarization side edge 21 of the polarizer 2 is flush with the first cover film side edge 31 of the cover film 3.

For another example, as shown in FIG. 5F, FIG. 5G, FIG. 5H, FIG. 5I and FIG. 5J, FIG. 5G is a schematic sectional view in a position of a dotted line AA1 in FIG. 5F, FIG. 5H is a schematic sectional view in a position of a dotted line AA2 in FIG. 5F, FIG. 5I is a schematic sectional view in a position of a dotted line AA3 in FIG. 5F, and FIG. 5J is a schematic sectional view in a position of a dotted line AA4 in FIG. 5F. The bonding side includes the first side edge 11 and the second side edge 12; the third polarization side edge 23 of the polarizer 2 and the third cover film side edge 33 of the cover film 3 are both flush with the third side edge 13 of the display module 1; the fourth polarization side edge 24 of the polarizer 2 and the fourth cover film side edge 34 of the cover film 3 are both flush with the fourth side edge 14 of the display module 1; the first polarization side edge 21 of the polarizer 2 is flush with the first cover film side edge 31 of the cover film 3; and the second polarization side edge 22 of the polarizer 2 is flush with the second cover film side edge 32 of the cover film 3.

Specifically, referring to FIG. 5H, the display module may include a panel film layer 12, the panel film layer 12 may include a display film layer 122 and a touch film layer 121 located on one side of the display film layer 122 facing the polarizer. Specifically, the panel film layer 12 may further include a substrate film layer 123 located on one side of the display film layer 122 away from the touch film layer 121. The touch film layer 121 has a first touch portion 1211 overlapping with the polarizer, and a second touch portion 1212 extending from the first touch portion 1211 towards the second side edge. The touch film layer 121 is bonded to a touch chip 120 through the second touch portion 1212.

Specifically, referring to FIG. 5G, the display film layer 122 includes a first display portion 1221 overlapping with the touch film layer 121, and a second display portion 1222 extending from the first display portion 1221 towards the first side edge 11. The display film layer 122 is bonded to a display chip 110 through the second display portion 1222.

For another example, as shown in FIG. 5K, FIG. 5L, FIG. 5M, FIG. 5N and FIG. 5O, FIG. 5L is a schematic sectional view in a position of a dotted line AA1 in FIG. 5K, FIG. 5M is a schematic sectional view in a position of a dotted line AA2 in FIG. 5K, FIG. 5N is a schematic sectional view in a position of a dotted line AA3 in FIG. 5K, and FIG. 5O is a schematic sectional view in a position of a dotted line AA4 in FIG. 5K. The bonding side includes the first side edge 11, the second side edge 12 and the third side edge 13; the fourth polarization side edge 24 of the polarizer 2 and the fourth cover film side edge 34 of the cover film 3 are both flush with the fourth side edge 14 of the display module 1; the first polarization side edge 21 of the polarizer 2 is flush with the first cover film side edge 31 of the cover film 3; the second polarization side edge 22 of the polarizer 2 is flush with the second cover film side edge 32 of the cover film 3; and the third polarization side edge 23 of the polarizer 2 is flush with the third cover film side edge 33 of the cover film 3.

It can be understood that the display panel in the embodiment of the present disclosure is manufactured by means of the method for manufacturing a display panel provided by an embodiment of the present disclosure, for example, as shown in FIG. 7, the display panel 100 with the cover film laminated thereto can be subjected to laser shape cutting along a position shown by a dotted line in FIG. 7 so as to obtain the display panel provided by the embodiment of the present disclosure.

During specific implementation, illustration is made by taking the display chip being bonded to the first side edge 11 of the display module 1 for example, especially, as shown in FIG. 7, which may be a schematic diagram of the bonding side, the display device may further include a Chip on Film (COF) 200 connected with the display panel 100, and a Flexible Printed Circuit (FPC) board 300 connected with the COF 200, an integrated circuit (IC) 201 may be further arranged on the COF 200. The IC 201 may be the display chip 110, that is, the display chip 110 (IC 201) may be bonded to the first side edge 11 of the display module 1 through the COF 200.

Figure 8:
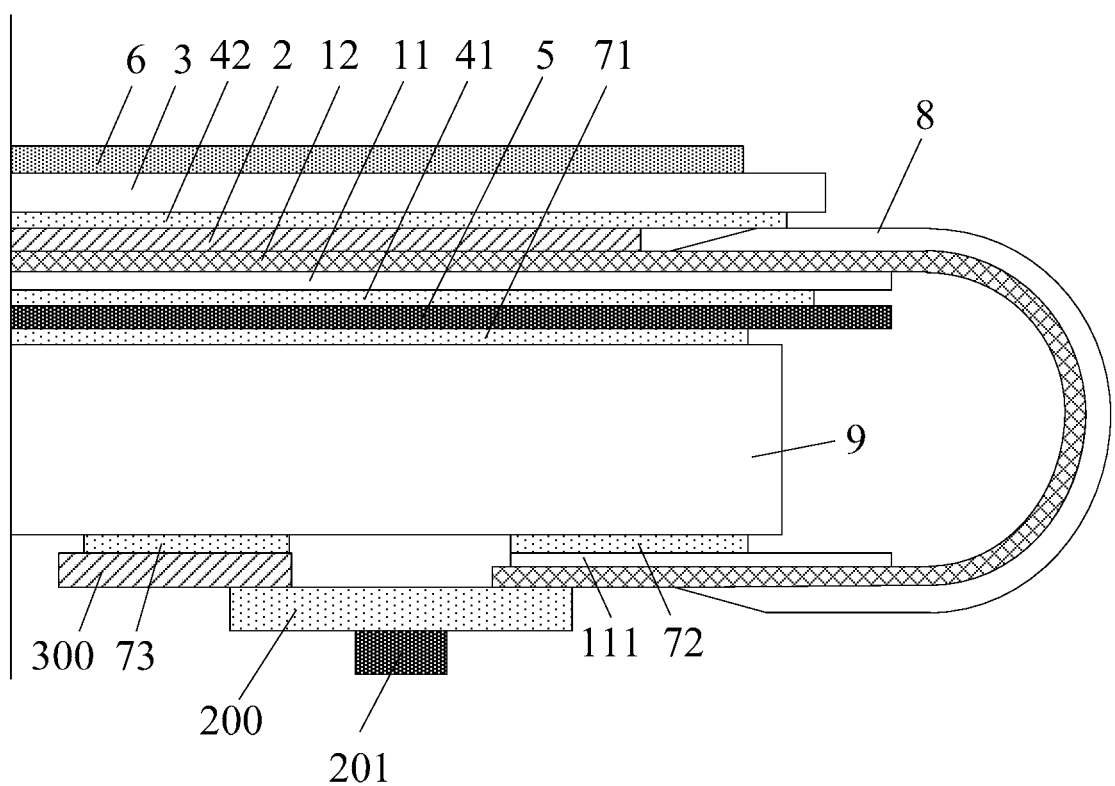
FIG. 8 is a schematic structural sectional view in an arrow AB direction in FIG. 7.

Specifically, a schematic sectional view along an arrow AB after the display panel in FIG. 7 is bent may be shown in FIG. 8, which may be a schematic sectional view of the bonding side. In other words, the display device may further include: a supporting structure 9 (especially, the supporting structure 9 may be a thick copper sheet) located on one side of the cooling fin 5 away from the first optical clear adhesive 41, and a first double sided adhesive tape 71 located between the supporting structure 9 and the cooling fin 5. The display film layer 12 is bent to a back surface. One side, facing the supporting structure 9, of a portion of the display film layer 12 bent to the back surface is further provided with a back surface back film 111, the back surface back film 111 is laminated to the supporting structure 9 through a second double sided adhesive tape 72, and the FPC board 300 is laminated to the supporting structure 9 through a third double sided adhesive tape 73. Specifically, a micro coating 8 may be further laminated to the bent portion of the display film layer 12, may adopt an MCL adhesive and is used to protect the display film layer 12 in the bent region.

Figure 6A:
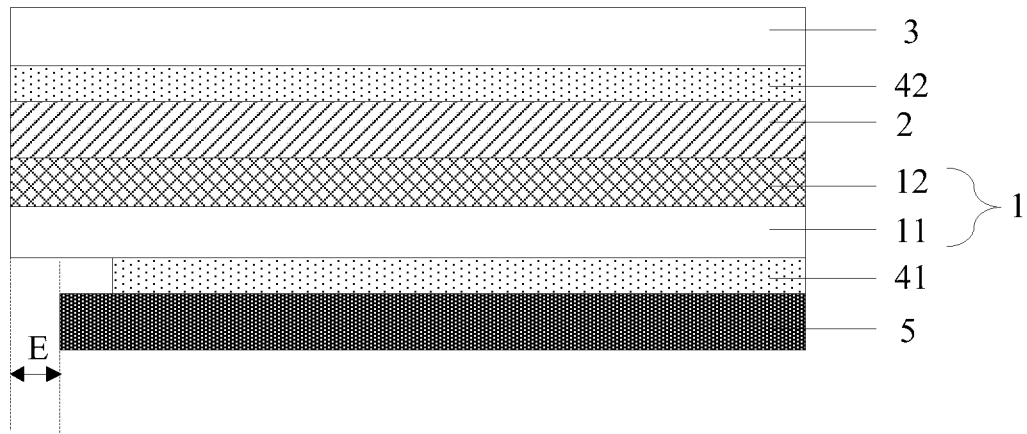
FIG. 6A is a thirteenth schematic sectional view of a display panel provided by an embodiment of the present disclosure.
Figure 6B:
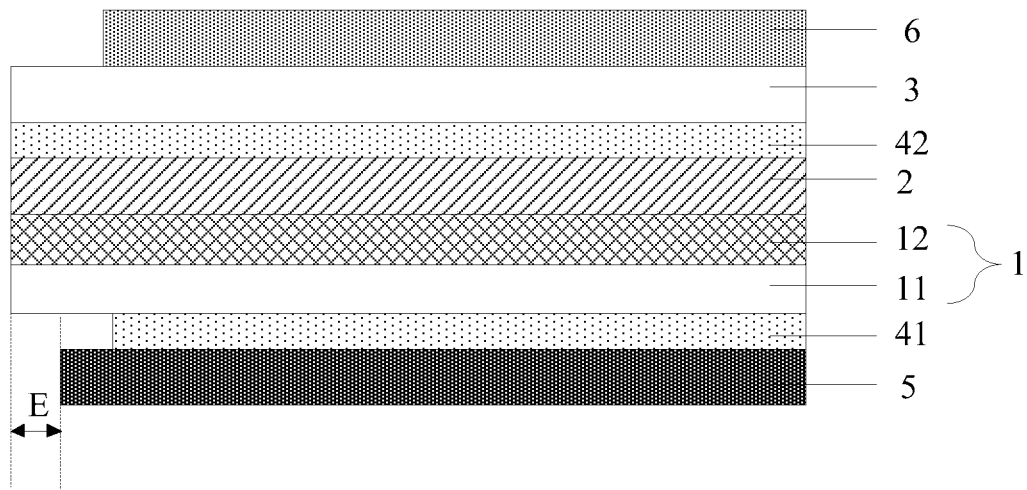
FIG. 6B is a fourteenth schematic sectional view of a display panel provided by an embodiment of the present disclosure.

During specific implementation, as shown in FIG. 6A, FIG. 6B and FIG. 8, the display module 1 may include: the back film 11, and the panel film layer 12 located on one surface of the back film 11 facing the polarizer 2. The back film 11 may include polysulfonamide (PSA) fiber film layer and a polyimide (PI) film layer which are laminated. Specifically, in order to meet a folding requirement, the back film (BF) may be a structural design of 13 um PSA+25 um PI. Specifically, as shown in FIG. 5H and FIG. 5G, the panel film layer 12 may include the substrate film layer 121, and the display film layer 122 and the touch film layer 123 sequentially located on one surface of the substrate film layer 121.

During specific implementation, as shown in FIG. 6A, FIG. 6B and FIG. 8, FIG. 6A and FIG. 6B may be schematic sectional views of non-bonding sides of the display panel, the display panel further includes: the cooling fin 5, located on the surface of the display module 1 away from the polarizer 2.

In a possible implementation, as shown in FIG. 6A, a size of the cooling fin 5 is smaller than that of the display module 1, that is, an orthographic projection of the cooling fin 5 on the back film 11 is covered by a region occupied by the back film 11. In the embodiment of the present disclosure, as the cooling fin 5 does not need to be cut integrally, considering a factor of a lamination tolerance ±0.1 mm and the like, an outline dimension of the cooling fin 5 may adopt unilateral inwards shrinkage E=0.15 um. A material of the cooling fin 5 may be metal or an organic material, especially, the material of the cooling fin 5 may be a stainless steel sheet (SUS). When the material of the cooling fin 5 is the stainless steel sheet (SUS), the cooling fin 5 can play a role in supporting and resilience besides cooling.

Figure 6C:
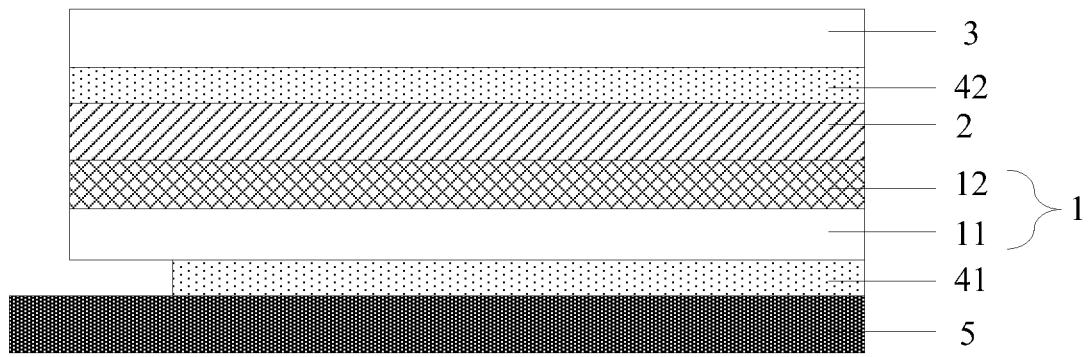
FIG. 6C is a fifteenth schematic sectional view of a display panel provided by an embodiment of the present disclosure.

In a possible implementation, as shown in FIG. 6C, the display module includes the back film 11, and the orthographic projection of the cooling fin 5 on the back film 11 covers the region occupied by the back film 11.

In a possible implementation, as shown in FIG. 6A, FIG. 6B and FIG. 6C, the cooling fin 5 may be of an integrated structure. When the cooling fin 5 is of the integrated structure, its thickness may be 30 um to 50 um, for example, may be 40 um.

Figure 6D:
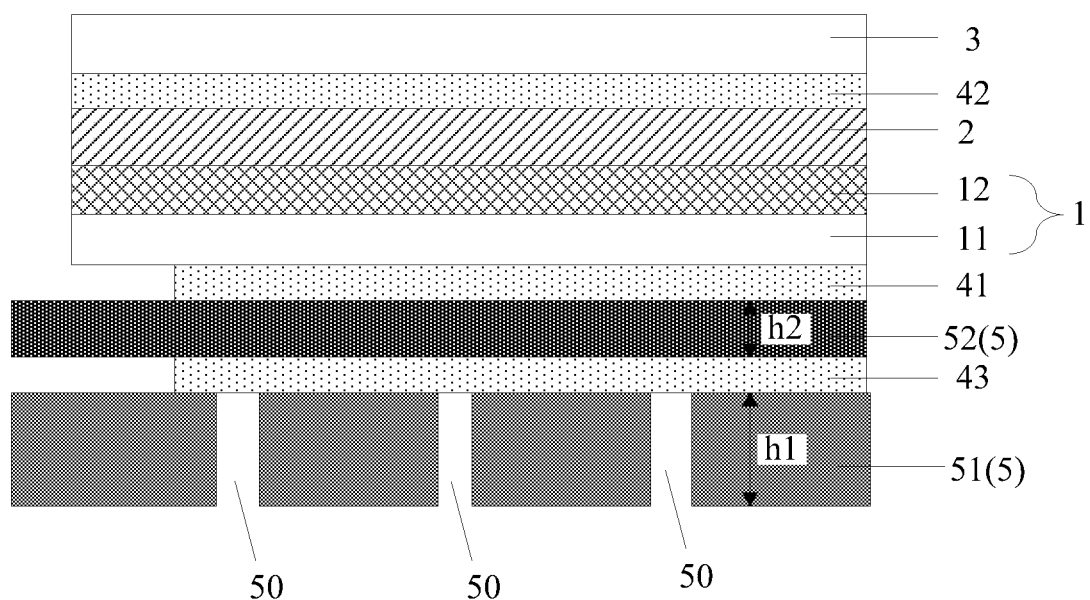
FIG. 6D is a sixteenth schematic sectional view of a display panel provided by an embodiment of the present disclosure.

In a possible implementation, as shown in FIG. 6D, the cooling fin 5 may include a first sub-cooling layer 51, and a second sub-cooling layer 52 located on one side of the first sub-cooling layer 51 facing the display module 1. Specifically, a thickness h1 of the first sub-cooling layer 51 may be larger than a thickness h2 of the second sub-cooling layer 52. Specifically, the thickness of the first sub-cooling layer 51 may be 30 um to 50 um, for example, may be 40 um. The thickness h2 of the second sub-cooling layer 52 may be 100 um to 200 um, for example, may be 150 um.

Specifically, as shown in FIG. 6D, the first sub-cooling layer 51 is provided with a plurality of patterns 50. Specifically, a distribution density of patterns 50 of the first sub-cooling layer 51 in a folded region may be larger than a distribution density in a non-folded region.

Specifically, as shown in FIG. 6D, an adhesive layer 43 is further arranged between the first sub-cooling layer 51 and the second sub-cooling layer 52. Specifically, the adhesive layer 43 may be an optical clear adhesive or a pressure-sensitive adhesive.

Specifically, as shown in FIG. 6A, the first optical clear adhesive 41 is further arranged between the cooling fin 5 and the display module 1, and the cooling fin 5 is laminated to the display module 1 through the first optical clear adhesive 41. A size of the first optical clear adhesive 41 is smaller than the size of the cooling fin 5, that is, the orthographic projection of the cooling fin 5 on the back film 11 covers an orthographic projection of the first optical clear adhesive 41 on the back film 11. Specifically, the first optical clear adhesive 41 may be a sticky layer, or other types of adhesives, for example, may be also a pressure-sensitive adhesive or a grid adhesive.

During specific implementation, as shown in FIG. 6A, the second optical clear adhesive 42 is further arranged between the cover film 3 and the polarizer 2, the cover film 3 is laminated to the polarizer 2 through the second optical clear adhesive 42, and an outer edge of the second optical clear adhesive 42 except an outer edge of the second optical clear adhesive 42 at the bonding side is flush with the outer edge of the display module 1 except the outer edge of the display module 1 at the bonding side.

Specifically, a thickness of the cover film 3 may be 83 um, a thickness of the second optical clear adhesive 42 may be 50 um, a thickness of the polarizer 2 may be 55 um, a total thickness of the panel film layer on the back film may be 45 um, a thickness of the back film 11 may be 38 um, and a thickness of the first optical clear adhesive 41 may be 50 um.

Specifically, a whole flow of the display panel may include UV adhesive applying at a groove of the back film (B-Dispenser)→welding region cut (Pad cut)→COF bonding→FPC board bonding (FOF Bonding)→sealant coating for FPC board and COF (Dispenser)→polarizer laminating (POL Lami)→cover film laminating (Cover Lami)→shape cutting (shape cut)→protective film laminating (protective film Lami)→stainless steel sheet laminating (SUS Lami)→Slider laminating (Slider Lami)→flexible circuit board and COF being bent and then laminated to a back side of the module (PAD bending).

It needs to be noted that in the above method provided by the embodiment of the present disclosure, a patterning process involved in forming each layer of structure may not only include part or all of processes such as deposition, photoresist coating, mask plate masking, exposure, developing, etching and photoresist lift off, but also include other processes, which is according to a figure of a needed pattern formed during actual manufacturing and is not limited herein. For example, a post-baking process may be further included after developing and before etching. The deposition process may be a chemical vapor deposition method, a plasma enhanced chemical vapor deposition method or a physical vapor deposition method, which is not limited herein. A mask plate used in the masking process may be a half tone mask, a single slit mask or a gray tone mask, which is not limited herein. Etching may be drying etching or wet etching, which is not limited herein.

Based on the same disclosed concept, an embodiment of the present disclosure further provides a display device, including a display panel provided by an embodiment of the present disclosure.

The display device may be: a mobile phone, a tablet computer, a TV, a display, a laptop, a digital photo frame, a navigator, a smart watch, a fitness wristband, a personal digital assistant and any product or component with a displaying function. Other necessary components of the display device may be understood by those of ordinary skill in the art, which will neither be repeated in detail herein nor supposed to serve as limit to the present disclosure. Besides, a principle of the display device for solving problems is similar to a principle of the above display panel for solving the problems, so implementation of the display device may refer to the embodiment of the above liquid crystal display panel, and repetitions are omitted.

The embodiments of the present disclosure have the following beneficial effects: the method for manufacturing the display panel provided by the embodiment of the present disclosure, includes: the polarizer is laminated to the light exit surface of the display module; and the cover film is laminated to the surface of the polarizer away from the display module. Integrated shape cutting is performed on the display module with the polarizer and the cover film laminated thereto, that is laminating of the polarizer and the cover film to the surface of the display module is completed, and then integrated shape cutting is performed on the display module with the polarizer and the cover film laminated thereto. Compared with the prior art that in general, the display module with the polarizer laminated thereto is cut soon after the polarizer is laminated, and then the cover film is laminated, which may need the cover film to have the reserved expanding size relative to the display module due to estimation of the process errors, and consequently, the finally formed display panel has a large bezel. By means of the method for manufacturing the display panel provided by the embodiment of the present disclosure, cutting is performed after the cover film is laminated, so the problem that the cover film needs to have the reserved expanding size and consequently the bezel of the display panel is wide can be avoided.

Preferable embodiments of the present disclosure are already described, those of skill in the art can make extra changes and modifications for these embodiments once they know the basic inventive concept. Therefore, the appended claims intend to be constructed as including the preferential embodiments and all the changes and the modifications falling within the scope of the present disclosure.

Apparently, those of skill in the art can make various changes and transformations for the embodiments of the present disclosure without departing from the spirit and scope of the embodiments of the present disclosure. In this case, if these changes and transformations of the embodiments of the present disclosure fall within the scope of the claims and their equivalents of the present disclosure, the present disclosure also intends to contain these changes and transformations.

What is claimed is:

1. A display panel, comprising:
    a display module;
    a polarizer, on a light exit surface of the display module, wherein at least one outer edge of the polarizer is flush with an outer edge of the display module;

a cover film, on one surface of the polarizer away from the display module, wherein an outer edge of the cover film except an outer edge of the cover film at a bonding side is flush with an outer edge of the display module except an outer edge of the display module at the bonding side; and a cooling fin, on one surface of the display module away from the polarizer;

wherein the cooling fin comprises a first sub-cooling layer, and a second sub-cooling layer on one side of the first sub-cooling layer facing the display module.

2. The display panel according to claim 1, wherein the display module comprises: a first side edge and a second side edge opposite to each other, a third side edge connected with one end of the first side edge and one end of the second side edge, and a fourth side edge connected with the other end of the first side edge and the other end of the second side edge;

the polarizer comprises: a first polarization side edge corresponding to the first side edge, a second polarization side edge corresponding to the second side edge, a third polarization side edge corresponding to the third side edge, and a fourth polarization side edge corresponding to the fourth side edge; and the cover film comprises: a first cover film side edge corresponding to the first side edge, a second cover film side edge corresponding to the second side edge, a third cover film side edge corresponding to the third side edge, and a fourth cover film side edge corresponding to the fourth side edge.

3. The display panel according to claim 2, wherein the bonding side comprises the first side edge;

the second polarization side edge of the polarizer and the second cover film side edge of the cover film are both flush with the second side edge of the display module;

the third polarization side edge of the polarizer and the third cover film side edge of the cover film are both flush with the third side edge of the display module;

the fourth polarization side edge of the polarizer and the fourth cover film side edge of the cover film are both flush with the fourth side edge of the display module; and the first polarization side edge of the polarizer is flush with the first cover film side edge of the cover film.

4. The display panel according to claim 2, wherein the bonding side comprises the first side edge and the second side edge;

the third polarization side edge of the polarizer and the third cover film side edge of the cover film are both flush with the third side edge of the display module;

the fourth polarization side edge of the polarizer and the fourth cover film side edge of the cover film are both flush with the fourth side edge of the display module;

the first polarization side edge of the polarizer is flush with the first cover film side edge of the cover film; and the second polarization side edge of the polarizer is flush with the second cover film side edge of the cover film.

5. The display panel according to claim 4, wherein the display module comprises a display film layer and a touch film layer on one side of the display film layer facing the polarizer;

the touch film layer is provided with a first touch portion overlapping with the polarizer, and a second touch portion extending from the first touch portion towards the second side edge; and the touch film layer is bonded to a touch chip through the second touch portion.

6. The display panel according to claim 5, wherein the display film layer comprises a first display portion overlapping with the touch film layer, and a second display portion extending from the first display portion towards the first side edge; and the display film layer is bonded to a display chip through the second display portion.

7. The display panel according to claim 2, wherein the bonding side comprises the first side edge, the second side edge and the third side edge;

the fourth polarization side edge of the polarizer and the fourth cover film side edge of the cover film are both flush with the fourth side edge of the display module;

the first polarization side edge of the polarizer is flush with the first cover film side edge of the cover film;

the second polarization side edge of the polarizer is flush with the second cover film side edge of the cover film; and the third polarization side edge of the polarizer is flush with the third cover film side edge of the cover film.

8. The display panel according to claim 1, wherein the display module comprises a back film, and an orthographic projection of the cooling fin on the back film is covered by a region occupied by the back film; or the display module comprises a back film, and an orthographic projection of the cooling fin on the back film covers a region occupied by the back film.

9. The display panel according to claim 1, wherein a thickness of the first sub-cooling layer is larger than that of the second sub-cooling layer.

10. The display panel according to claim 1, wherein a first optical clear adhesive is between the cooling fin and the display module, and the cooling fin and the display module are laminated through the first optical clear adhesive.

11. The display panel according to claim 10, wherein a second optical clear adhesive is between the cover film and the polarizer, and an outer edge of the second optical clear adhesive except an outer edge of the second optical clear adhesive at the bonding side is flush with the outer edge of the display module except the outer edge of the display module at the bonding side.

12. A display device, comprising the display panel according to claim 1.

13. The display panel according to claim 1, wherein an adhesive layer is between the first sub-cooling layer and the second sub-cooling layer.

14. The display panel according to claim 1, wherein a material of the cooling fin is stainless steel.

15. A method for manufacturing a display panel, comprising:

laminating a polarizer to a light exit surface of a display module;

laminating a cover film to one surface of the polarizer away from the display module;

performing integrated shape cutting on an outer edge of the display module with the polarizer and the cover film laminated thereto except an outer edge of the display module at a bonding side; and laminating a cooling fin to one surface of the display module away from the polarizer;

wherein the cooling fin comprises a first sub-cooling layer, and a second sub-cooling layer on one side of the first sub-cooling layer facing the display module.

16. The method according to claim 15, wherein the laminating the cooling fin to the surface of the display module away from the polarizer comprises:

laminating the cooling fin a size of which is smaller than a size of the display module to the surface of the display module away from the polarizer.

17. The method according to claim 15, wherein the laminating the cooling fin to the surface of the display module away from the polarizer comprises:

laminating the cooling fin to the surface of the display module away from the polarizer through a first optical clear adhesive.

18. The method according to claim 15, wherein after the performing integrated shape cutting on the display module with the polarizer and the cover film laminated thereto and before the laminating the cooling fin to the surface of the display module away from the polarizer, the method further comprising:

laminating a protective film to one surface of the cover film away from the polarizer.

19. The method according to claim 17, wherein the laminating the cover film to the surface of the polarizer away from the display module comprises:

laminating the cover film to the surface of the polarizer away from the display module through a second optical clear adhesive.

20. The method according to claim 15, wherein the performing integrated shape cutting on the display module with the polarizer and the cover film laminated thereto comprises:

performing integrated shape cutting on the display module with the polarizer and the cover film laminated thereto through a laser cutting process.

* * * * *